(12) United States Patent
Tai et al.

(10) Patent No.: US 8,609,976 B2
(45) Date of Patent: Dec. 17, 2013

(54) SOLAR CELL MODULE

(75) Inventors: Chun-Han Tai, Hsin-Chu (TW);
Yi-Chia Chen, Hsin-Chu (TW);
Chia-Hsun Tsai, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 26 days.

(21) Appl. No.: 13/450,704

(22) Filed: Apr. 19, 2012

(65) Prior Publication Data

US 2013/0061904 A1    Mar. 14, 2013

(30) Foreign Application Priority Data

Sep. 14, 2011    (TW) .............................. 100133034 A

(51) Int. Cl.
*H01L 31/042*    (2006.01)

(52) U.S. Cl.
USPC ............................ 136/244; 136/206; 136/252

(58) Field of Classification Search
USPC ......................................... 136/206, 244, 252
See application file for complete search history.

(56) References Cited

U.S. PATENT DOCUMENTS

2002/0044331 A1*  4/2002  Agrawal et al. ............... 359/265
2004/0200522 A1*  10/2004  Fukawa et al. ................ 136/259

FOREIGN PATENT DOCUMENTS

TW    201110360    3/2011

* cited by examiner

*Primary Examiner* — Susan D Leong
(74) *Attorney, Agent, or Firm* — WPAT, PC; Justin King

(57) ABSTRACT

A solar cell module includes a plurality of solar cells. M first bus bar electrodes are disposed on a first surface of each of the solar cells. N second bus bar electrodes are disposed on a second surface of each of the solar cells. M is a natural number that is equal to or larger than 1, and N is a natural number that is larger than M.

10 Claims, 5 Drawing Sheets

SOLAR CELL MODULE

RELATED APPLICATIONS

This application claims priority to Taiwan Application Serial Number 100133034, filed Sep. 14, 2011, which is herein incorporated by reference.

BACKGROUND

1. Field of Invention

The present invention relates to a solar cell module.

2. Description of Related Art

Owing to the shortage of fossil fuels, awareness of the importance of environmental protection is increasing. Therefore, many have been actively developing technologies related to alternative energy and renewable energy in recent years, with the hope that the dependence on fossil fuels and the impact on the environment caused by using fossil energy can be reduced. Among the various kinds of technologies related to alternative energy and renewable energy, the solar cell is a technology that is receiving much attention. The reason for the interest in this technology is that solar cells can directly convert solar energy into electricity, and carbon dioxide or other harmful substances such as nitrogen compounds will not be produced during the process of power generation, so that the environment will not be polluted.

Silicon is the most important and widely used material in the semiconductor industry. Today, the technologies behind the production and supply of silicon wafers are already at a quite mature stage. The energy gap of silicon is suitable for absorbing sunlight, and it is for at least this reason that silicon solar cells have become the most widely used solar cells. Generally, a monocrystalline silicon solar cell or a polycrystalline silicon solar cell includes the layers of an external electrode, an anti-reflective layer, an n-type semiconductor layer, and a p-type semiconductor layer.

Generally, the material of the external electrode is a combination of various metals, such as nickel, silver, aluminum, copper, and palladium. In order to maintain a sufficient electron flow, the transmission area between the electrodes and the substrate must be adequately large. However, in order to reduce the shielding rate of an external electrode with respect to incident light, the area that the external electrode covers on the substrate must be as small as possible. Therefore, the structural design of the external electrode must take into account properties such as low resistance and low light-shielding rate. Currently available external electrodes can be divided into sections of bus bar electrodes and finger electrodes. A cross-sectional area of the bus bar electrode is larger than a cross-sectional area of the finger electrode. If the structure of a tree is used as a comparison, the bus bar electrode is like the trunk of the tree, and the finger electrodes are like branches of the tree spreading on the surface of the whole solar cell. The electrons will converge toward the bus bar electrode via the finger electrodes and then toward the external load. That is to say, the bus bar electrode with its larger size will help to improve the electron flow, and the finger electrodes with their smaller size will help to reduce the light-shielding rate.

In a currently available solar cell, there are either two or three bus bar electrodes on each of the first surface and the second surface of the solar cell. While a solar cell that has two bus bar electrodes on each of the first surface and the second surface has a lower light-shielding rate than a solar cell that has three bus bar electrodes on each of the first surface and the second surface, the energy loss of the former type of solar cell is larger than the energy loss of the latter type of solar cell. Therefore, many in the field are endeavoring to design a solar cell in such a manner to decrease the energy loss without increasing the light-shielding rate of the solar cell.

SUMMARY

In order to solve the problems of the prior art, the invention provides an io improved solar cell module. The number of bus bar electrodes disposed on each of a first surface and a second surface of a solar cell is different, so that the efficiency of the solar cell can be effectively improved without increasing the light-shielding rate of the solar cell. Furthermore, conventional welding members are not used in the solar cell of the invention. Instead, an improved welding member having a suitable structure for use with the solar cell of the invention is provided, namely, a structure that is in line with the requirement of improving the efficiency of the solar cell without increasing the light-shielding rate thereof.

According to an embodiment of the invention, a solar cell module includes a plurality of solar cells. M first bus bar electrodes are disposed on a first surface of each of the solar cells. N second bus bar electrodes are disposed on a second surface of each of the solar cells. M is a natural number that is equal to or larger than 1, and N is a natural number that is larger than M.

In an embodiment of the invention, the solar cell module further includes a plurality of welding members. Each of the welding members includes a first welding portion and a second welding portion that are connected to each other. The first welding portion is welded on the first bus bar electrodes of one of the solar cells, and the second welding portion is welded on the second bus bar electrodes of the solar cell adjacent to said one of the solar cells having disposed thereon the first bus bar electrodes on which the first welding portion is welded.

In an embodiment of the invention, the first welding portion includes P first tapping wires, and P is a natural number that is equal to M. Each of the first tapping wires is welded on the corresponding first bus bar electrode.

In an embodiment of the invention, the second welding portion is a metal thin film, and the width of the second welding portion is sufficient to cover the N second bus bar electrodes.

In an embodiment of the invention, the second welding portion includes Q second tapping wires, and Q is a natural number that is equal to or smaller than N.

In an embodiment of the invention, Q is equal to N, and each of the second tapping wires is welded on the corresponding second bus bar electrode.

In an embodiment of the invention, the length of each of the second tapping wires is smaller than the length of each of the first tapping wires.

In an embodiment of the invention, the second welding portion includes a connection bar. The connection bar is welded on the second surface of the adjacent solar cell. The connection bar has a first side and a second side. Each of the first tapping wires is connected to the first side, and each of the second tapping wires is connected to the second side.

In an embodiment of the invention, the first tapping wires and the second tapping wires are substantially perpendicular to the connection bar.

In an embodiment of the invention, the first welding portion has a bending region. The bending region is connected to the connection bar. A gap is formed between the solar cell to which the first welding portion corresponds and the solar cell to which the second welding portion corresponds. The bending region is located in the gap.

It is to be understood that both the foregoing general description and the following detailed description are by examples, and are intended to provide to further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
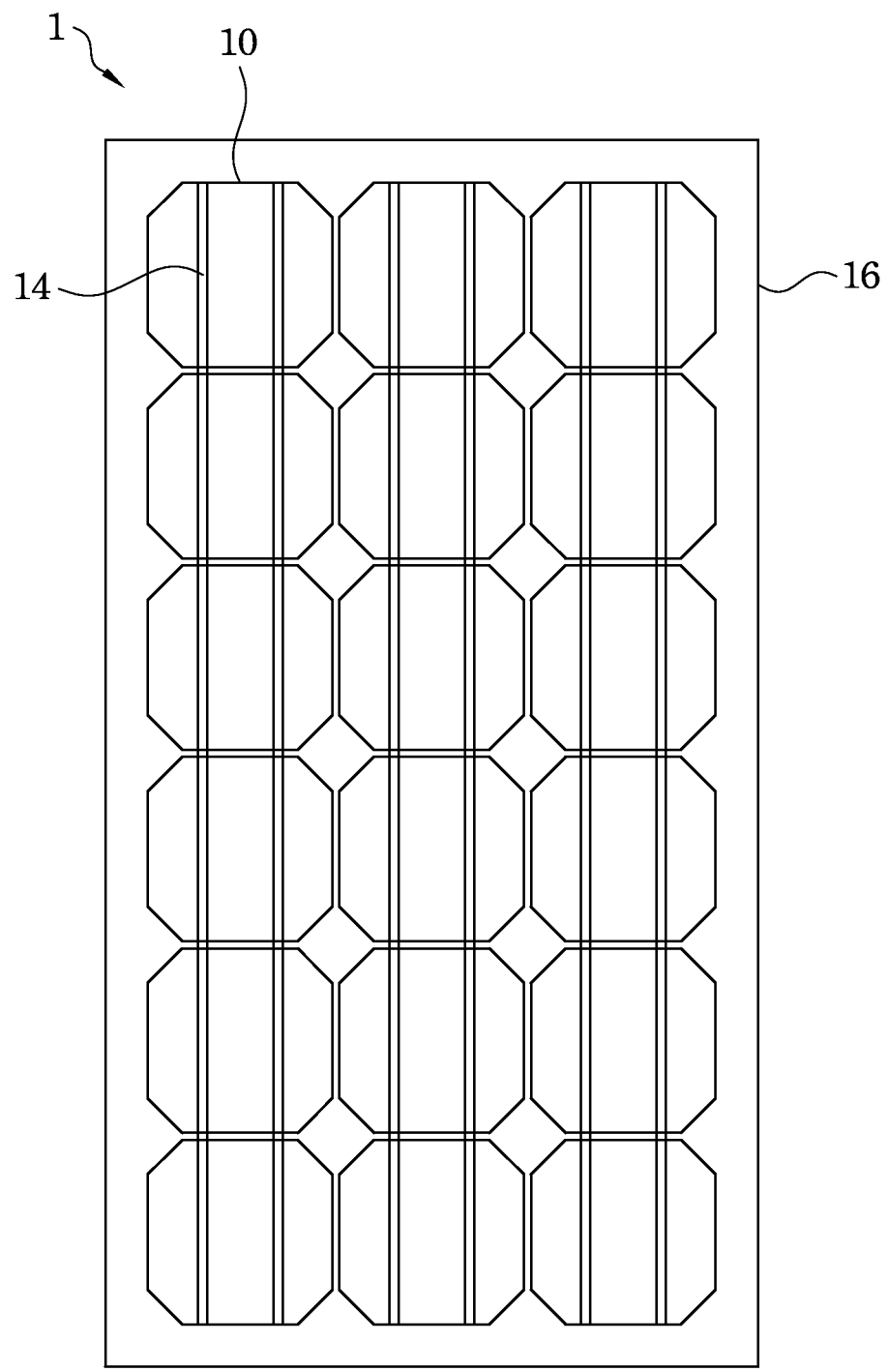
FIG. 1 is a top view of a solar cell module according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

An improved solar cell module is provided. Specifically, the number of bus bar electrodes disposed on each of a first surface and a second surface of a solar cell is different, so that the efficiency of the solar cell can be effectively improved without increasing the light-shielding rate of the solar cell. Furthermore, conventional welding members are not used in the solar cell of the invention. Instead, an improved welding member having a suitable structure for use with the solar cell of the invention is provided, namely, a structure that is in line with the requirement of improving the efficiency of the solar cell without increasing the light-shielding rate thereof.

FIG. 1 is a top view of a solar cell module according to an embodiment of the invention.

As shown in FIG. 1, a solar cell module 1 includes a plurality of solar cells 10. The solar cells 10 of the solar cell module 1 are arranged in an array and disposed on a substrate 16. In some embodiments, the solar cells 10 are adhered on the substrate 16. The solar cells 10 of the solar cell module 1 can be connected in series or in parallel. In the embodiment, the solar cells 10 of the solar cell module 1 are arranged in an array of six rows and three columns, but the invention is not limited in this regard.

In an embodiment, the size of each solar cell 10 is within a range between 10×10 cm and 21×21 cm. For instance, the size of each solar cell 10 can be 15.6×15.6 cm. However, a larger or a smaller size/dimension can also be used. The substrate for forming each of the solar cells 10 of the invention can be made of single crystal silicon, polycrystalline silicon, amorphous silicon, silicon strip, cadmium telluride, gallium arsenide, etc. The shape of the substrate for forming each of the solar cells 10 can be square, rectangular, round, or oval, but the invention is not limited in this regard.

Figure 2A:
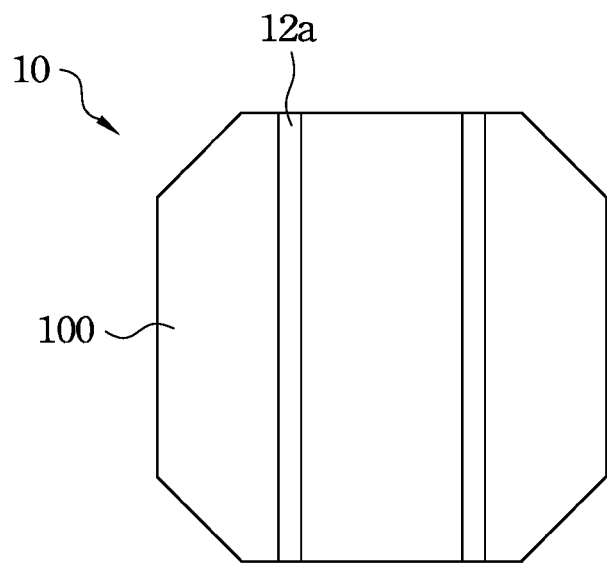
FIG. 2A is a top view of a first surface of any one of a plurality of solar cells in FIG. 1.
Figure 2B:
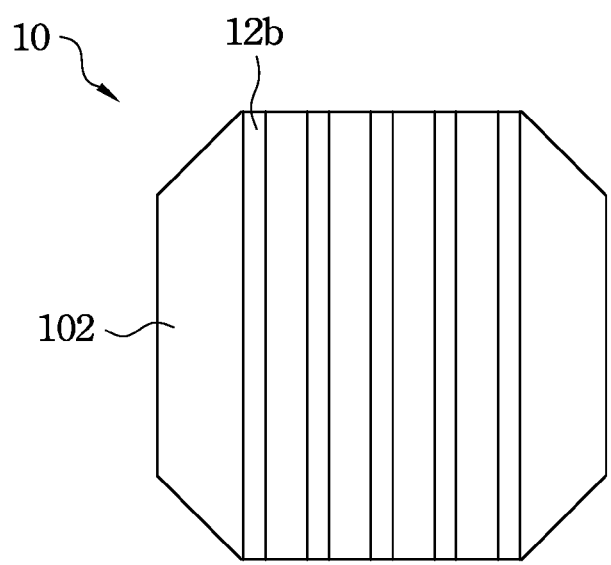
FIG. 2B is a top view of a second surface of the solar cell in FIG. 2A.

FIG. 2A is a top view of a first surface 100 of one of the solar cells 10 in FIG. 1. FIG. 2B is a top view of a second surface 102 of the solar cell 10 in FIG. 2A.

As shown in FIG. 2A, M first bus bar electrodes 12a are disposed on the first surface 100 of the solar cell 10. As shown in FIG. 2B, N second bus bar electrodes 12b are disposed on the second surface 102 of the solar cell 10. In the embodiment, the first surface 100 is a light-facing surface of the solar cell 10, and the second surface 102 is a light-backing surface of the solar cell 10, but the invention is not limited thereto. That is, the amount of light received by the first surface 100 is larger than the amount of light received by the second surface 102 of the solar cell 10. M is a natural number that is equal to or larger than 1, and N is a natural number that is larger than M. The electrons converged by the bus bar electrodes 12a, 12b via finger electrodes (not shown) can be then transmitted toward an external load (not shown) via the bus bar electrodes 12a, 12b.

Since the total shielding area of the first bus bar electrodes 12a is reduced as the number of the first bus bar electrodes 12a on the first surface 100 of the solar cell 10 is minimized, the efficiency of power generation of the solar cell 10 can be increased in view of the small number of the first bus bar electrodes 12a. Furthermore, since the total conductive area of the second bus bar electrodes 12b can be increased as the number of the second bus bar electrodes 12b on the second surface 102 of the solar cell 10 is maximized, the energy loss among the solar cells 10 can be reduced in view of the large number of the second bus bar electrodes 12b. In other words, the smaller the number of the first bus bar electrode 12a on the first surface 100 of the solar cell 10 the better, while the greater the number of the second bus bar electrodes 12b on the second surface 102 of the solar cell 10 the better. That is, the performance of the solar cell 10 can be effectively improved by through a design in which the number of the first bus bar electrode 12a is smaller than that of the second bus bar electrodes 12b. In the embodiment, as shown in FIG. 2A and FIG. 2B, the number of the first bus bar electrode 12a on the first surface 100 of the solar cell 10 is two, and the number of the second bus bar electrodes 12b on the second surface 102 of the solar cell 10 is five, but the invention is not limited in this regard.

In an embodiment, the width of each of the first bus bar electrodes 12a is within a range about 1.5 to 2 mm, and the width of each of the second bus bar electrodes 12b is within a range about 2.7 to 4.5 mm, but the invention is not limited in this regard.

Figure 3:
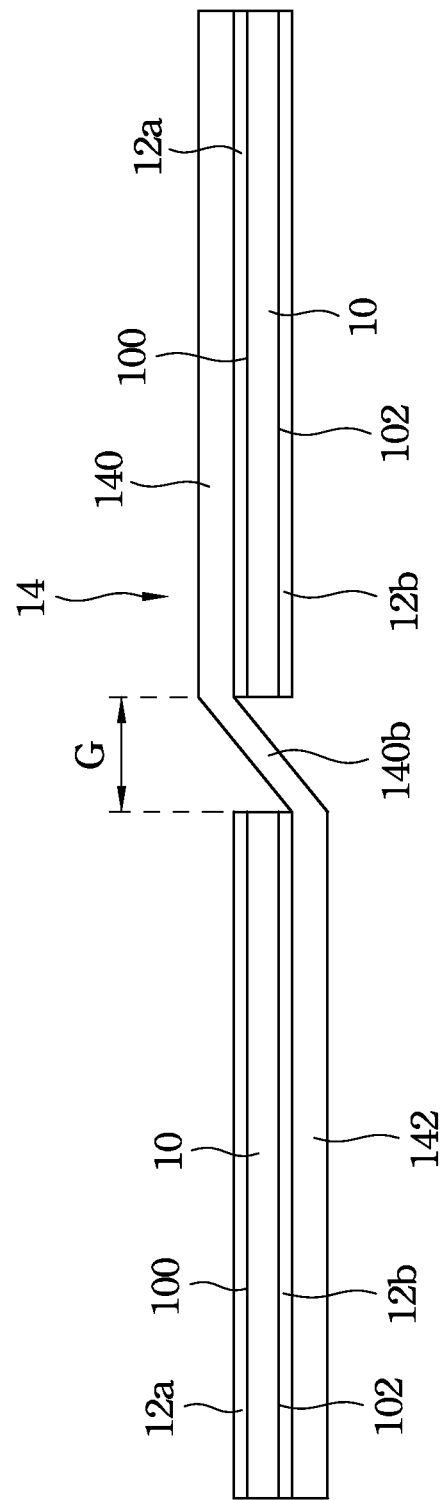
FIG. 3 is a side view of two adjacent solar cells in FIG. 1.

FIG. 3 is a side view of two adjacent solar cells in FIG. 1.

As shown in FIG. 1 and FIG. 3, the solar cell module 1 further includes a plurality of welding members 14. Each of the welding members 14 includes a first welding portion 140 and a second welding portion 142 that are connected to each other. The first welding portion 140 of each welding member 14 is welded on the first bus bar electrodes 12a of one of the solar cells 10. The second welding portion 142 of each welding member 14 is welded on the second bus bar electrodes 12b of the solar cell 10 adjacent to the solar cell 10 having disposed thereon the first bus bar electrodes 12a on which the first welding portion 140 is welded (hereinafter referred to as "the adjacent solar cell 10"). Through such a configuration, current collected with the first bus bar electrodes 12a disposed on the first surface 100 of one of the solar cells 10 is transmitted to the second bus bar electrodes 12b disposed on the second io surface 102 of the adjacent solar cell 10. Hence, the solar cells 10 in the same column of the solar cell module 1 can be connected in series. In an embodiment, the foregoing welding members 14 are made of tined copper ribbons.

Figure 4A:
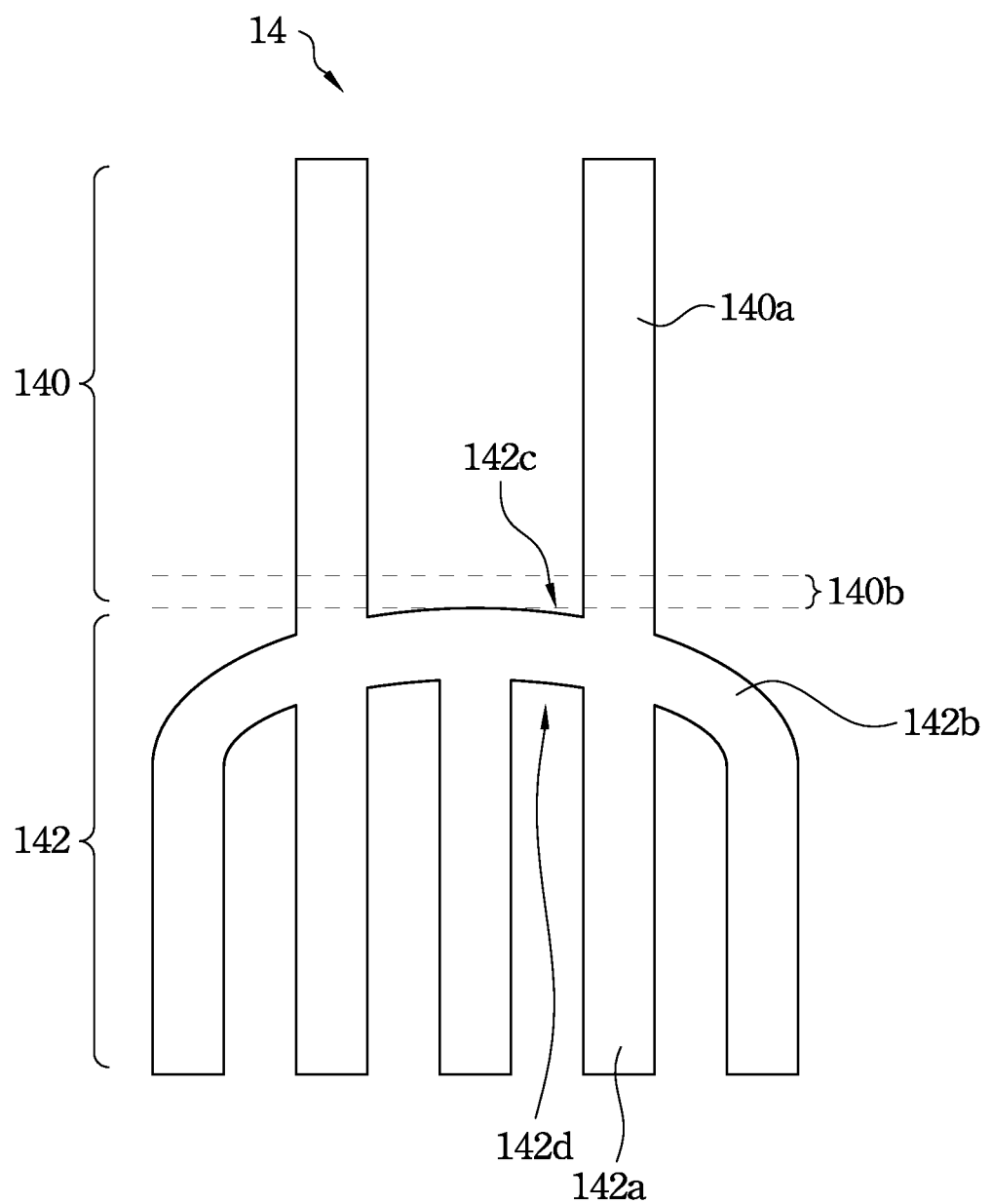
FIG. 4A is a top view of an embodiment of a welding member in FIG. 3.

FIG. 4A is a top view of an embodiment of a welding member 14 in FIG. 3.

As shown in FIG. 4A, the first welding portion 140 of the welding member 14 includes P first tapping wires 140a. In order not to increase the light-shielding area on the first surface 100 of the solar cell 10 caused by the welding member 14, the number P of the first tapping wires 140a included in the first welding portion 140 of the welding member 14 is equal to the number M of first bus bar electrodes 12a on the first surface 100 of the solar cell 10. Furthermore, each of the first tapping wires 140a of the first welding portion 140 is welded on the corresponding first bus bar electrode 12a. In other words, each of the first tapping wires 140a of the first welding portion 140 and the corresponding first bus bar electrode 12a overlap each other, so the light-shielding area on the first surface 100 of the solar cell 10 will not be increased after each of the first tapping wires 140a of the first welding portion 140 is welded on the corresponding first bus bar electrode 12a. In the embodiment, there are two first bus bar electrodes 12a disposed on the first surface 100 of the solar cell 10, so there are also two first tapping wires 140a included in the first welding portion 140 of the welding member 14.

In an embodiment, the second welding portion 142 of the second welding member 14 includes Q second tapping wires 142a, as shown in FIG. 4A. Q is a natural number that is equal to or smaller than N (i.e., the number of the second bus bar electrodes 12b). If the number Q of the second tapping wires 142a included in the second welding portion 142 of the welding member 14 is equal to the number N of the second bus bar electrodes 12b on the second surface 102 of the solar cell 10, each of the second tapping wires 142a is welded on the corresponding second bus bar electrode 12b. If the number Q of the second tapping wires 142a included in the second welding portion 142 of the welding member 14 is smaller than the number N of the second bus bar electrodes 12b on the second surface 102 of the solar cell 10, the second welding portion 142 can similarly achieve the function of transmitting current only if the welding region of the second tapping wires 142a of the second welding portion 142 covers all of the second bus bar electrodes 12b. In the embodiment, there are five second bus bar electrodes 12b disposed on the second surface 102 of the solar cell 10, so there are also five second tapping wires 142a included in the second welding portion 142 of the welding member 14, but the invention is not limited in this regard.

As shown in FIG. 4A, the second welding portion 142 of the welding member 14 includes a connection bar 142b. The connection bar 142b is welded on the second surface 102 of the adjacent solar cell 10. The connection bar 142b of the second welding portion 142 has a first side 142c and a second side 142d. Each of the first tapping wires 140a is connected to the first side 142c of the connection bar 142b, and each of the second tapping wires 142a is connected to the second side 142d of the connection bar 142b. That is, the connection bar 142b of the second welding portion 142 is located at the center of the welding member 14, and the first tapping wires 140a and the second tapping wires 142a having different numbers are respectively extended from the first side 142c and the second side 142d. In the embodiment, the first tapping wires 140a of the first welding portion 140 and the second tapping wires 142a of the second welding portion 142 are substantially perpendicular to the connection bar 142b, but the invention is not limited in this regard. In practice, the angle, shape, or location of the connection bar 142b of the second welding portion 142 relative to the first tapping wires 140a and the second tapping wires 142a can be adjusted in a manner corresponding to the alignment of the first bus bar electrodes 12a and the second bus bar electrodes 12b disposed on the solar cell 10.

Furthermore, because the connection bar 142b of the second welding portion 142 is welded on the second surface 102 of the adjacent solar cell 10, the length of each of the second tapping wires 142a of the second welding portion 142 is smaller than the length of each of the first tapping wires 140a of the first welding portion 140, as shown in FIG. 4A.

As shown in FIG. 3 and FIG. 4A, the first welding portion 140 of the welding member 14 has a bending region 140b. The bending region 140b of the first welding portion 140 is connected to the connection bar 142b of the second welding portion 142. When the solar cells 10 of the solar cell module 1 are arranged in an array and disposed on the substrate 16, a gap G is formed between the solar cell 10 to which the first welding portion 140 corresponds and the solar cell 10 to which the second welding portion 142 corresponds. The bending region 140b of the first welding portion 140 is located in the gap G between the foregoing solar cells 10. In an embodiment, the gap G between the foregoing solar cells 10 is 2.5 mm, but the invention is not limited in this regard. Because the first welding portion 140 additionally includes the bending region 140b in the gap G (not on the first surface 100) relative to the second welding portion 142, and the second welding portion 142 is completely located on the second surface 102 of the adjacent solar cell 10, the length of the first welding portion 140 is larger than the length of the second welding portion 142.

Figure 4B:
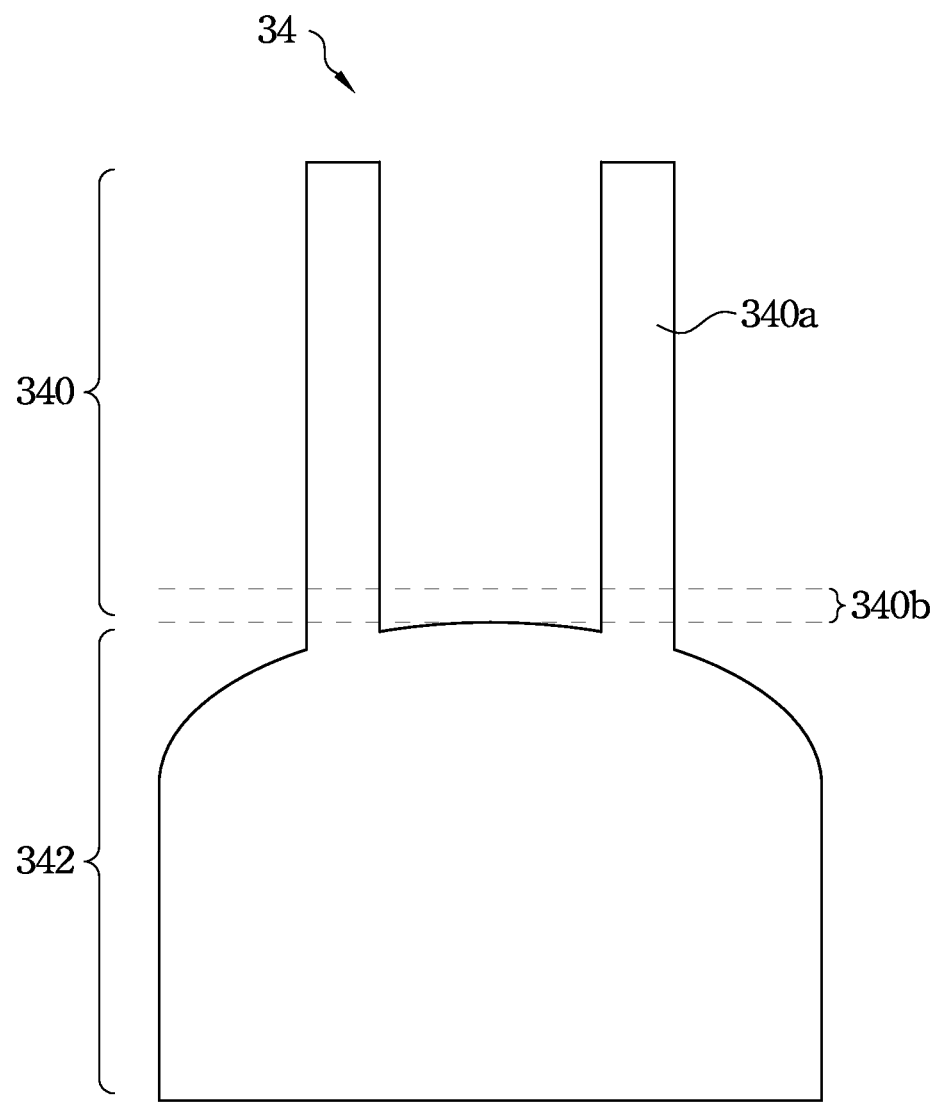
FIG. 4B is a top view of another embodiment of a welding member in FIG. 3.

FIG. 4B is a top view of another embodiment of a welding member in FIG. 3.

As shown in FIG. 4B, the second welding portion 342 of the second welding member 34 includes R second tapping wires. R is a natural number that is equal to or larger than 1. In the embodiment, the first welding portion 340 of the welding member 34 also has two first tapping wires 340a, and the first welding portion 340 of the welding member 34 also has a bending region 340b. The number R of the second tapping wires included in the second welding portion 342 of the welding member 34 is equal to one, which means that the second welding portion 342 of the welding member 34 is formed as a single piece of metal thin film. If the width of the metal thin film is sufficient to cover all of the second bus bar electrodes 12b (i.e., the welding region of the metal thin film covers all of the second bus bar electrodes 12b), the metal thin film can also achieve the function of transmitting current. Furthermore, the second welding portion 342 in the form of the metal thin film has a large conductive area, so the energy loss when transmitting current can be effectively reduced.

According to the foregoing recitations of the embodiments of the invention, it can be seen that the invention provides an improved solar cell module. The number of bus bar electrodes disposed on each of a first surface and a second surface of a solar cell is different, so that the efficiency of the solar cell can be effectively improved without increasing the light-shielding rate to of the solar cell. Furthermore, conventional welding members are not used in the solar cell of the invention. Instead, an improved welding member having a suitable structure for use with the solar cell of the invention is provided, namely, a structure that is in line with the requirement of improving the efficiency of the solar cell without increasing the light-shielding rate thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A solar cell module comprising:
a plurality of solar cells, M first bus bar electrodes being disposed on a first surface of each of the solar cells, N second bus bar electrodes being disposed on a second surface of each of the solar cells, wherein M is a natural number that is equal to or larger than 1, and N is a natural number that is larger than M.

2. The solar cell module of claim 1, further comprising a plurality of welding members, each of the welding members comprising a first welding portion and a second welding portion that are connected to each other, the first welding portion being welded on the first bus bar electrodes of one of the solar cells, the second welding portion being welded on the second bus bar electrodes of the solar cell adjacent to said one of the solar cells having disposed thereon the first bus bar electrodes on which the first welding portion is welded.

3. The solar cell module of claim 2, wherein the first welding portion comprises P first tapping wires, P is a natural number that is equal to M, and each of the first tapping wires is welded on the corresponding first bus bar electrode.

4. The solar cell module of claim 3, wherein the second welding portion is a metal thin film, and the width of the second welding portion is sufficient to cover the N second bus bar electrodes.

5. The solar cell module of claim 3, wherein the second welding portion comprises Q second tapping wires, and Q is a natural number that is equal to or smaller than N.

6. The solar cell module of claim 5, wherein Q is equal to N, and each of the second tapping wires is welded on the corresponding second bus bar electrode.

7. The solar cell module of claim 5, wherein the length of each of the second tapping wires is smaller than the length of each of the first tapping wires.

8. The solar cell module of claim 5, wherein the second welding portion comprises a connection bar, the connection bar is welded on the second surface of the adjacent solar cell, the connection bar has a first side and a second side, each of the first tapping wires is connected to the first side, and each of the second tapping wires is connected to the second side.

9. The solar cell module of claim 8, wherein the first tapping wires and the second tapping wires are substantially perpendicular to the connection bar.

10. The solar cell module of claim 8, wherein the first welding portion has a bending region, the bending region is connected to the connection bar, a gap is formed between the solar cell to which the first welding portion corresponds and the solar cell to which the second welding portion corresponds, and the bending region is located in the gap.

* * * * *